United States Patent
Delaunay et al.

(10) Patent No.: US 11,158,754 B1
(45) Date of Patent: Oct. 26, 2021

(54) BACK-TO-BACK DUAL BAND P-CB-N

(71) Applicant: HRL LABORATORIES LLC, Malibu, CA (US)

(72) Inventors: Pierre-Yves Delaunay, Santa Monica, CA (US); Brett Z. Nosho, Santa Monica, CA (US); Hasan Sharifi, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/455,820

(22) Filed: Aug. 8, 2014

Related U.S. Application Data

(60) Provisional application No. 61/864,479, filed on Aug. 9, 2013.

(51) Int. Cl.
| | |
|---|---|
| *H01L 31/101* | (2006.01) |
| *H01L 31/0216* | (2014.01) |
| *H01L 27/146* | (2006.01) |

(52) U.S. Cl.
CPC .... *H01L 31/1013* (2013.01); *H01L 27/14652* (2013.01); *H01L 31/02161* (2013.01)

(58) Field of Classification Search
None
See application file for complete search history.

(56) References Cited

U.S. PATENT DOCUMENTS

| | | | |
|---|---|---|---|
| 6,184,538 B1* | 2/2001 | Bandara | B82Y 20/00 250/338.4 |
| 6,369,436 B1* | 4/2002 | Gilman | 257/440 |
| 6,642,537 B1* | 11/2003 | Gunapala et al. | 257/21 |
| 7,687,871 B2 | 3/2010 | Maimon | |
| 7,795,640 B2 | 9/2010 | Klipstein | |
| 2004/0195509 A1* | 10/2004 | Sundaram | H01L 27/1465 250/338.1 |
| 2007/0235758 A1* | 10/2007 | Klipstein | H01L 31/101 257/188 |
| 2007/0241260 A1* | 10/2007 | Jaeger | H01L 31/1013 250/214.1 |
| 2010/0258892 A1* | 10/2010 | Butendeich et al. | 257/440 |
| 2014/0026937 A1* | 1/2014 | Andre | B82Y 20/00 136/244 |

OTHER PUBLICATIONS

"Band Offset" available at URL: https://en.wikipedia.org/wiki/Band_offset (Year: 2019).*

(Continued)

*Primary Examiner* — Erik Kielin
(74) *Attorney, Agent, or Firm* — Lewis Roca Rothgerber Christie, LLP

(57) ABSTRACT

A structure is disclosed. The structure contains a second detector disposed above a first detector, wherein the first detector contains a first absorber layer, a first barrier layer disposed above the first absorber layer, a first contact layer disposed above the first barrier layer, and wherein the second detector contains a second contact layer disposed above the first contact layer, a second barrier layer disposed above the second contact layer, a second absorber layer disposed above the second barrier layer.

21 Claims, 7 Drawing Sheets

(56) References Cited

OTHER PUBLICATIONS

Leon Melkonian, James Bangs, Lee Elizondo, Ron Ramey, Ernesto Guerrero, "Performance of MWIR and SWIR HgCdTe-based focal plane arraysat high operating temperatures", Proc. of SPIE vol. 7660 (2010).

A. Goldberg, T. Fischer, S. Kennerly, S. Wang, M. Sundaram, P. Uppal, M. Winn, and M. Stevens, in Proceedings of SPIE vol. 4028 (2000).

A. Rogalski in Infared Physics and Technology 43 p. 187-210 (2002).

D. Donetsky, S. P. Svensson, L. E. Vorobjev, and G. Belenky in Appl. Phys. Lett. 95, 212104 (2009).

Y. Delaunay, B.M. Nguyen, D. Hoffman, E.K. Huang, and M. Razeghi, in IEEE Journal of Quantum Electronics, vol. 45, No. 2, p. 157-162.—Feb. 1, 2009.

"High Operating Temperature XBn-InAsSb Ballade Detectors", Philip Klipstein, Olga Klin, Steve Grossman, Noam Snapi, Inna Lukomsky, Michael Yassen, Daniel Aronov, Eyal Berkowitz, Alex Glozman, Osnat Magen, Itay Shtrichman, Rami Frenkel and Eliezer WeissQuantum Sensing and Nanophotonic Devices IX, edited by Manijeh Razeghi, Eric Tournie, Gail J. Brown, Proc. of SPIE vol. 8268, 82680U—© 2012 SPIE.

S.D. Gunapala, et al., "1024×1024 pixel mid-wavelength and long-wavelength infrared QWIP focal plane arrays for imaging applications", *Semicond. Sci. Technol*. 20, 473 (2005), 8 pages.

S. Pour, et al., "High operating temperature midwave infrared photodiodes and focal plane arrays based on type-II InAs/GaSb superlattices", App. Phys. Letters 98, 143501 (2011), 3 pages.

R. Rehm, et al., "Dual-colour thermal imaging with InAs/GaSb superlattices in mid-wavelength infrared spectral range", Electronics Letters, vol. 42, No. 10 (2006), 2 pages.

E. Huang, et al., "Active and passive infrared imager based on short-wave and mid-wave type-II superlattice dual-band detectors", Optics Letters, vol. 38, No. 1, pp. 22-24.

\* cited by examiner

BACK-TO-BACK DUAL BAND P-CB-N

CROSS REFERENCE TO RELATED APPLICATIONS

This application claims the benefit of U.S. Provisional Application No. 61/864,479, filed on Aug. 9, 2013, which is incorporated herein by reference in its entirety. This application is related to U.S. patent application Ser. No. 13/351,997 (U.S. Pat. No. 8,847,202), filed on Jan. 17, 2012, titled "Dual-Band Type-II Superlattice Detectors Based on p-B-p Design," which is incorporated herein by reference in its entirety. This application is related to U.S. patent application Ser. No. 13/427,387 (U.S. Pat. No. 9,146,157), filed on Mar. 22, 2012, titled "Dual Band SWIR/MWIR and MWIR1/MWIR2 Infrared Detectors," which is incorporated herein by reference in its entirety.

FIELD

The present invention relates to detectors. More particularly, the present invention relates to photon detectors.

BACKGROUND

Dual band imaging can be performed with different material systems. HgCdTe-on-CdZnTe based detectors known in the art can perform dual band imaging with high performance at high temperature but the cost of the substrate makes it too expensive for the fabrication of large arrays ($200/cm$^2$). Although the structure can be grown on silicon (Si) material to decrease cost, the uniformity of the arrays degrades at temperatures higher than 120K as described by Leon Melkonian, James Bangs, Lee Elizondo, Ron Ramey, Ernesto Guerrero, "Performance of MWIR and SWIR HgCdTe-based focal plane arrays at high operating temperatures", Proc. of SPIE Vol. 7660 (2010), which is incorporated herein by reference in its entirety.

Quantum Well Infrared Photon Detectors (QWIP) known in the art can perform dual band imaging with a high uniformity. However, the narrow spectral response and the low operating temperature make it unsuitable for high operating temperature, as described by A. Goldberg, T. Fischer, S. Kennerly, S. Wang, M. Sundaram, P. Uppal, M. Winn, and M. Stevens, in Proceedings of SPIE Vol. 4028 (2000), which is incorporated herein by reference in its entirety. Also, QWIP detectors known in the art do not absorb normal incident light and require the fabrication of a grating or shallow sidewalls in order to absorb infrared signal, as described by A. Rogalski in Infared Physics and Technology 43 p. 187-210 (2002), which is incorporated herein by reference in its entirety.

InAs/GaSb superlattices (SLS) known in the art have short lifetime and high surface leakage which limits the dark current performance of focal plane array (FPA) pixels to $10^{-4}$ A/cm. This limits the applications to low backgrounds and low F number. This is explained in more detail by D. Donetsky, S. P. Svensson, L. E. Vorobjev, and G. Belenky in Appl. Phys. Lett. 95, 212104 (2009), which is incorporated herein by reference in its entirety. This is also explained in more detail by P. Y. Delaunay, B. M. Nguyen, D. Hoffman, E. K. Huang, and M. Razeghi, in IEEE Journal of Quantum Electronics, Vol. 45, No. 2, p. 157-162.—Feb. 1, 2009, which is incorporated herein by reference in its entirety.

Barrier detectors known in the art also perform imaging at high operating temperatures or at multiple wavelengths (MWIR/LWIR) using Ga free superlattice (InAs/InAsSb). However, these barrier detectors have to be wet etched because the turn-on of small dry-etched pixels is too high for FPA configurations. These barrier detectors are not suitable for dual band pixels because they would generate a significant undercut, thus reducing the fill factor of the array. Also, n-B-n devices have to be operated at −0.6V of bias as described in more detail in "High Operating Temperature XBn-InAsSb Bariode Detectors", Philip Klipstein, Olga Klin, Steve Grossman, Noam Snapi, Inna Lukomsky, Michael Yassen, Daniel Aronov, Eyal Berkowitz, Alex Glozman, Osnat Magen, Itay Shtrichman, Rami Frenkel and Eliezer Weiss Quantum Sensing and Nanophotonic Devices IX, edited by Manijeh Razeghi, Eric Tournie, Gail J. Brown, Proc. of SPIE Vol. 8268, 82680U•© 2012 SPIE, which is incorporated herein by reference in its entirety.

In view of the limitation in prior art, a need exists for improved photon detectors.

BRIEF DESCRIPTION OF THE FIGURES

FIG. 1a depicts layer diagram of a device according to the present disclosure.
FIG. 1b depicts a band structure of the device in FIG. 1a.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

High operating temperature middle wavelength infrared (MWIR) detectors using InAsSb absorbers and dual band detector based on Ga-free SLS use a barrier design such as n-B-n or n-CB-n to perform infrared detection. In this configuration, a reverse bias (>100 mV) is applied to collect the photon generated carriers. This bias significantly increases (>0.5V) for small pixels that are delineated using a plasma etch process. Unfortunately, multiple pixels in an array break down before they are fully turned-on. This degrades the operability of focal plane arrays (FPAs) based on this technology. Also, common read out integrated circuits (ROICs) cannot apply more than 500 mV of bias and therefore cannot operate these devices. In the single color case, this problem is solved by wet etching the mesas. This is possible because the etching only has to reach the barrier, which is a few hundred of nanometers deep. This approach is not suitable for dual band devices because the barrier is buried under the Band 2 absorber, which is several microns thick. Wet etch pixels would have significant undercut and low fill factor, reducing the optical efficiency of the device and creating some blind areas within the field of view.

A single color p-CB-n architecture has demonstrated the potential to operate close to zero bias, due to the internal electric field generated by the doping difference between p-type contact and n-type absorber regions. This property resulted in a significant improvement in the turn-on voltage of small dry-etched pixels. More details about p-CB-n photon detectors are described in U.S. Provisional application 61/721,315 entitled "High performance MWIR detector" filed on Nov. 1, 2012, which is incorporated herein by reference in its entirety.

Figures 1A, 1B:
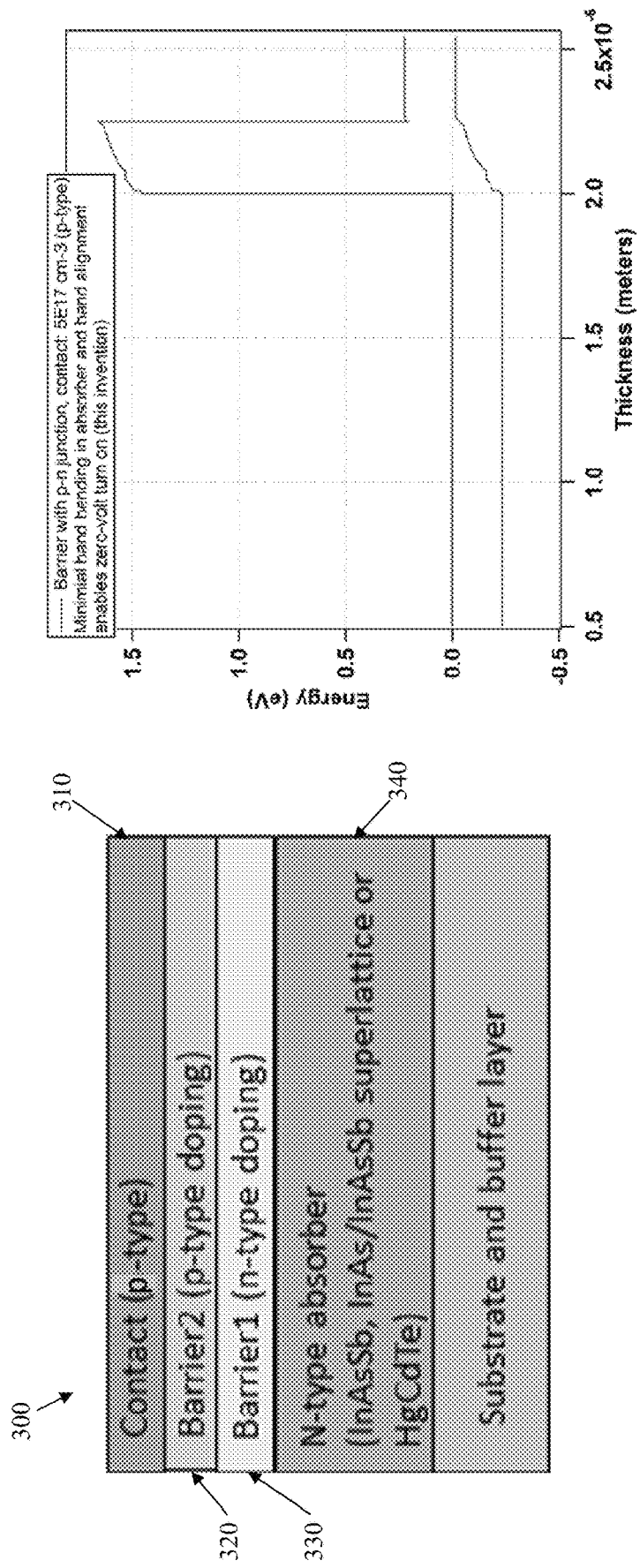
Figure 2:
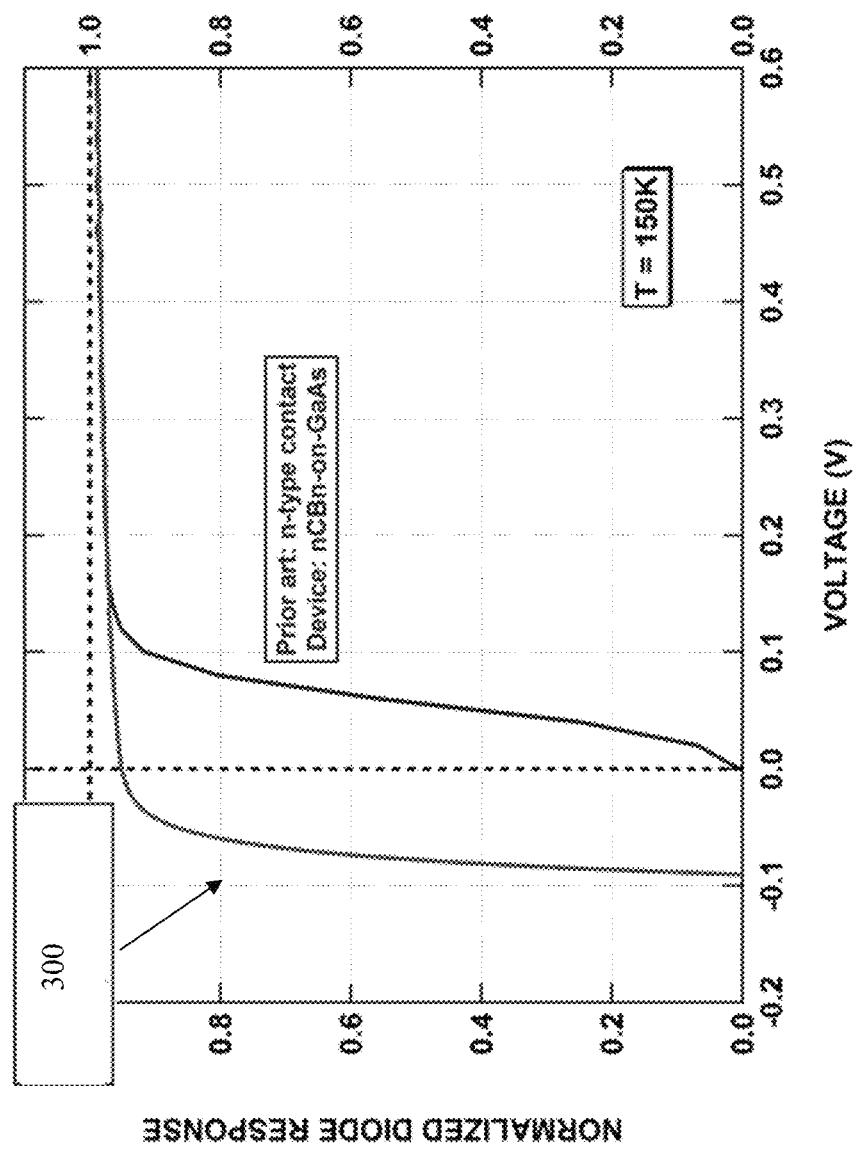
FIG. 2 depicts comparison of the turn-on voltage of a wet etched n-CB-n and p-CB-n.
Figure 3:
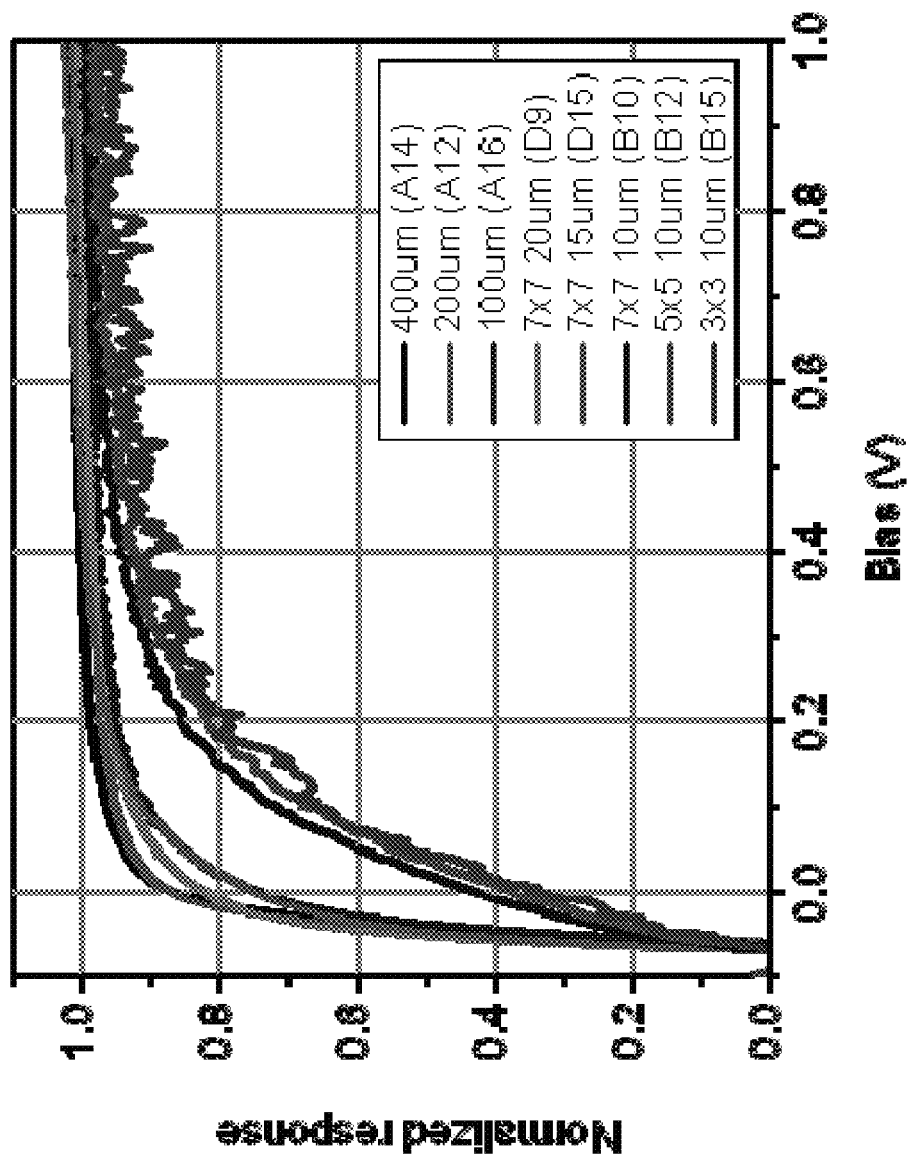
FIG. 3 depicts normalized response of dry-etched single color p-CB-n detectors.

Referring to FIG. 1a, a single color p-CB-n device 300 consists of a top p-type contact layer 310, a p-type barrier 320, an n-type barrier 330 and an n-type absorber 340. The introduction of a p-n junction within the wide band gap material generates an electric field that separates photo generated carriers without the application of a bias on the device. As a result, the device 300 can operate at a low bias as shown in FIG. 2. Furthermore, this property extends to dry etched single color detectors as shown in FIG. 3. FIG. 1b depicts band structure of the device 300.

According to some embodiments, a novel dual band bipolar semiconductor structure based on InAsSb or InAs/InAsSb superlattices (Ga-free SLS) absorbers is presently disclosed. In some embodiments, two back-to-back p-CB-n detectors using InAsSb or Ga-free absorber regions are combined to perform dual band imaging. In some embodiments, the newly presented design can perform infrared detection with low dark current and low turn-on voltage, even for small size pixels. In some embodiments, the presently disclosed structures can be implemented with other absorber materials such as HgCdTe, InAs/GaSb superlattices, etc.

Presently disclosed embodiment may be applied to form a dual band FPAs. As pixels have to be dry-etched, the structure has to enable low bias operation, even in the presence of recombination centers or band bending at the sidewall surface. The presently disclosed embodiment may improve the operability of dual band infrared imagers. Presently disclosed embodiments may also allow the repeatable fabrication of small pitch FPAs with low turn-on bias (<500 mV), compatible with common ROICs.

In some embodiments, two single color devices may be combined using a highly doped common p-type contact. In some embodiments, the doping of this layer is high in order to ensure the proper flow of current from one device to the other. Also, any band discontinuity in the band corresponding to minority carriers (valence band for holes and conduction band for electrons) has to be placed in a highly doped region in order to ensure the proper flow of minority carriers through the device.

In some embodiments, the p-CB-n structures presently disclosed are combined with different absorber band gaps in order to create a two color detector. Such a detector would carry the low turn-on property of dry etched small pixels to two color FPAs, thus improving their operability and lower the voltage that has to be applied on the detectors.

Figure 4:
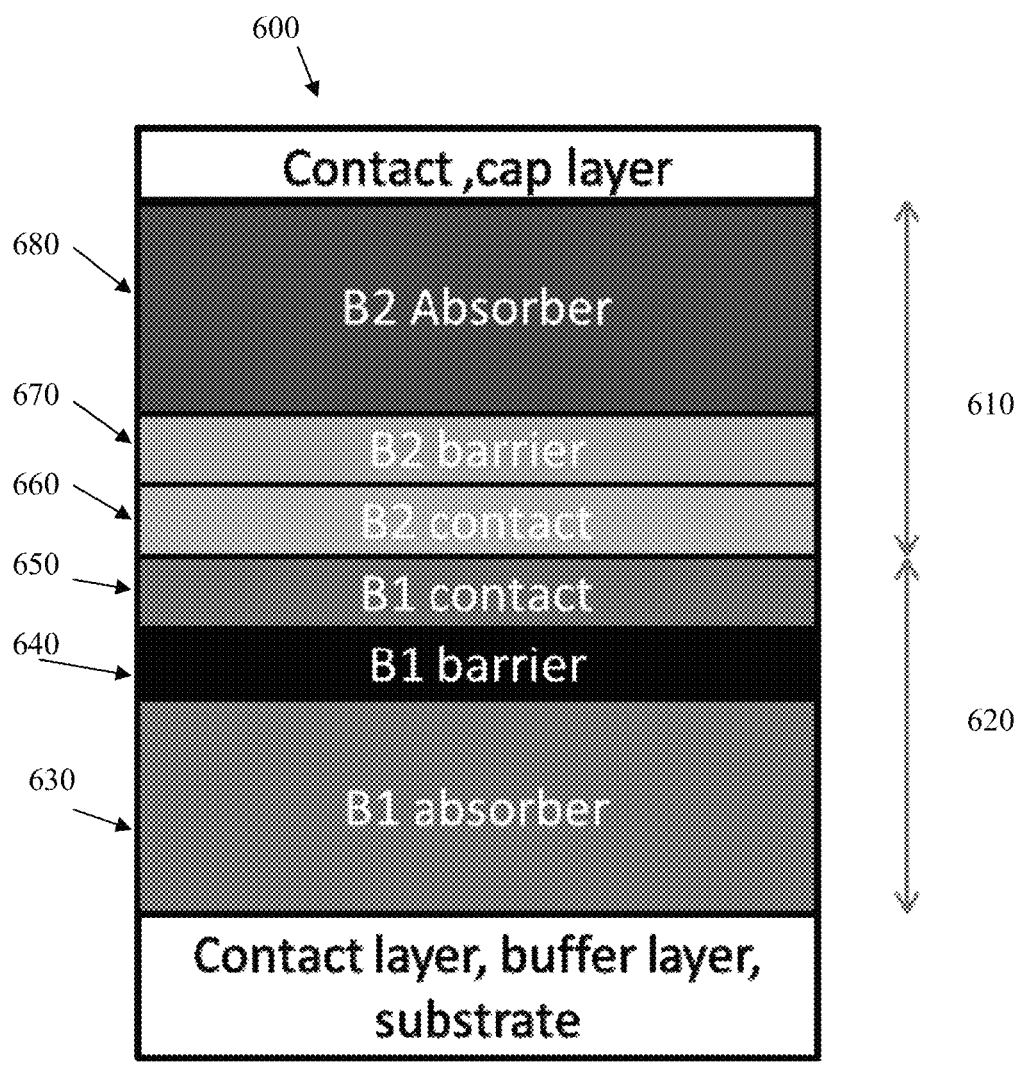
FIG. 4 depicts another layer structure according to the present disclosure.

In some embodiments, structure 600 is disclosed as shown in FIG. 4. The structure 600 comprises detector 610 formed above detector 620.

In some embodiments, the detector 620 configured for band 1 is grown. The n-type absorber 630 is grown, followed by an electron barrier 640 and a contact layer 650.

In some embodiments, the absorber 630 comprises a bulk (InAsSb, HgCdTe, etc) or SLS (InAsSb/InAs, InAs/GaSb, etc) material that is sensitive in the infrared. This material performs infrared sensing with a cutoff wavelength $\lambda_1$. The thickness of the absorber 630 is in the order of several microns. In one embodiment, the absorber 630 is n-type.

In some embodiments, the barrier 640 comprises a bulk or SLS material with a wider band gap than the absorber 630. In some embodiments, the valence band of the barrier 640 aligns with the absorber 630 to ensure the flow of minority hole carriers from the absorber 630 into the barrier 640. In one embodiment, the doping in the barrier 640 may be low (<1e16 cm$^{-3}$) and p-type. In some embodiments, the doping may be increased abruptly or through a gradient. The composition of the barrier 640 does not have to be the same across the barrier 640. In one embodiment, a discontinuity in the valence band between the barrier 640 and the absorber 630 may have a negative impact on the turn-on of the detectors as the holes will not flow easily from one layer to the other. This may be mitigated by increasing the doping in the barrier 640.

In some embodiments, the barrier 640 may be configured to block majority electron carriers, thus reducing the dark current. In some embodiments, the thickness of the barrier 640 is in the order of several hundred nanometers.

In some embodiments, the contact 650 comprises bulk or SLS material that is p-doped. The doping can be graded or constant through the layer and it may terminate with a high doping concentration (>1e16 cm$^{-3}$). This is done to make sure that the injection of carrier between the detector 620 and the detector 610 is not compromised. In one embodiment, the thickness of the contact 650 is in the order of several hundred nanometers.

In some embodiments, the detector 610 for band 2 is grown. A contact layer 660 for band 2 is grown, followed by an electron barrier 670 and the n-type absorber 680 for band 2.

In some embodiments, the contact 660 comprises bulk or SLS material that is p-doped. In some embodiments, the contact 660 comprises the same material as the contact 650. In some embodiments, the contact 660 comprises the material that is different from the material used for the contact 650. The doping can be graded or constant through the layer but it may start with a high doping concentration (>1e16 cm$^{-3}$). This is done to make sure that the injection of carrier between the detector 620 and the detector 610 is not compromised, even if there is a band discontinuity in the valence band between the contact 660 and the contact 650. In some embodiments, the thickness of the contact 660 is in the order of several hundred nanometers.

In some embodiments, the barrier 670 comprises a bulk or SLS material with a wider band gap than the absorber 680. In some embodiments, the valence band of the barrier 670 aligns with the absorber 680 to ensure the flow of minority hole carriers from the absorber 680 into the barrier 670. In some embodiments, the doping in this layer should be low (<1e16 cm$^{-3}$) and p-type. In some embodiments, the doping can then be increased abruptly or through a gradient. The composition of the barrier 670 does not have to be the same across the barrier 670. A discontinuity in the valence band between the two layers may have a negative impact on the turn-on of the detectors as the holes will not flow easily from one layer to the other. This may be avoided by increasing the doping in the barrier 670.

In some embodiments, the barrier 670 is configured to block majority electron carriers, thus reducing the dark current. In some embodiments, the thickness of the barrier 670 is in the order of several hundred nanometers.

In some embodiments, the absorber 680 comprises a bulk (InAsSb, HgCdTe, etc) or SLS (InAsSb/InAs, InAs/GaSb, etc) material that is sensitive in the infrared. This material performs infrared sensing with a cutoff wavelength $\lambda_2$. In some embodiments, the thickness of the absorber 680 is in the order of several microns. In some embodiments, the absorber 680 is n-type.

In some embodiments, n-type hole barriers may be added before the detector 620 and after the detector 610. These extra barriers would have a higher band gap than the absorber 630 and the absorber 680. The higher band gap regions would help mitigate the effect of surface leakage.

Figure 5A:
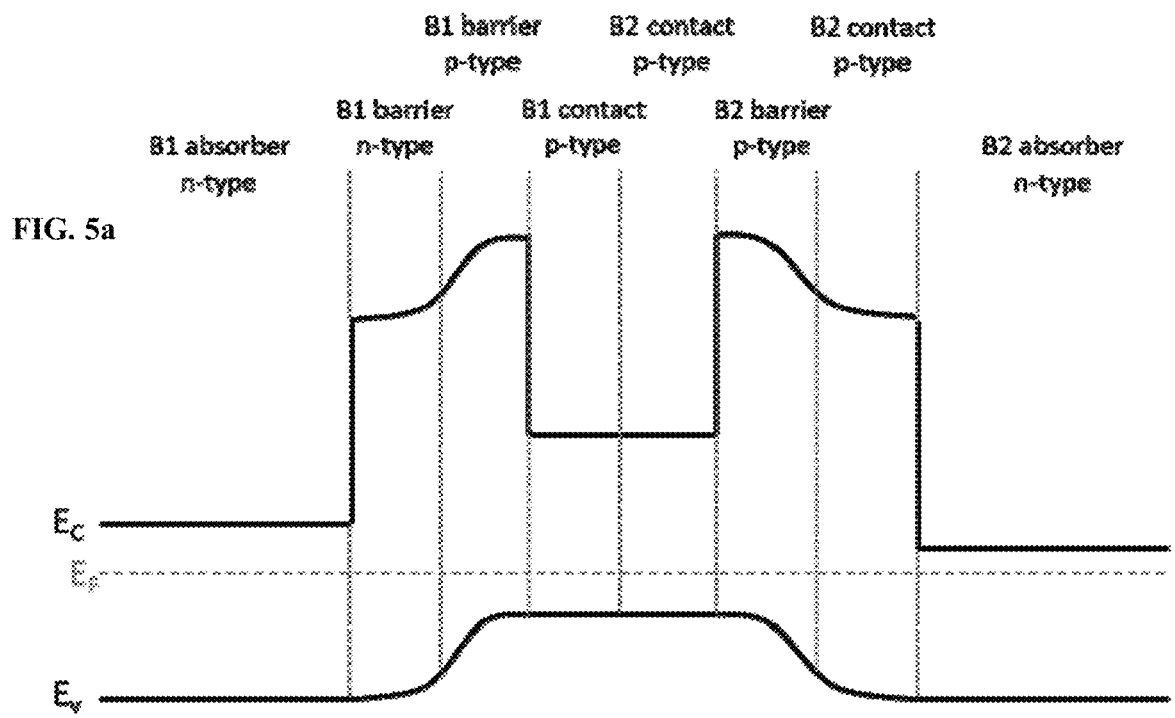
FIGS. 5a-e depict band structure of devices according to the present disclosure.
Figure 5B:
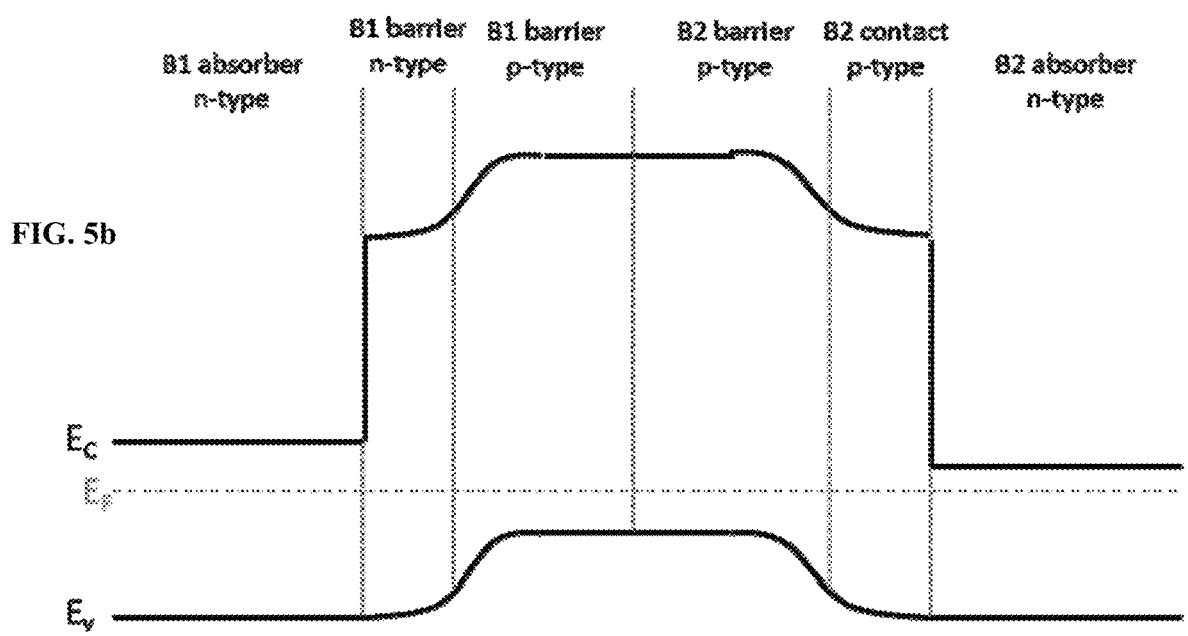

In some embodiments, the structure 600 is operated as a back-to-back p-n junction: the diode performing sensing is reverse biased while the other one is inactive and under forward bias. Each detector 610, 620 can be optimized independently, using different electron barriers and contacts. The doping in the contact layers has to be high so that each detector 610, 620 is highly conductive in forward bias. This ensures that the carriers photo-excited in the reverse biased detector flow easily into and through the forward biased sensor. The p-n junctions in each detector create an electric field region that separate photo excited carrier even in the absence of a high bias FIG. 5*a* presents a band structure for structure 600 in the case of perfect alignment of the valence bands in all the layers, where the contact layer 650 and contact layer 660 have low bandgap. FIG. 5*b* presents a band structure for structure 600 in the case of perfect alignment of the valence bands in all the layers, where the contact layer 650 and contact layer 660 have high bandgap. If there is any discontinuity in the valence band of the different materials, this may be mitigated by increasing the p-type doping at the interface between these layers. This creates a short depletion (a few nanometers) region with a high field that the minority hole carriers can tunnel through.

Figure 5C:
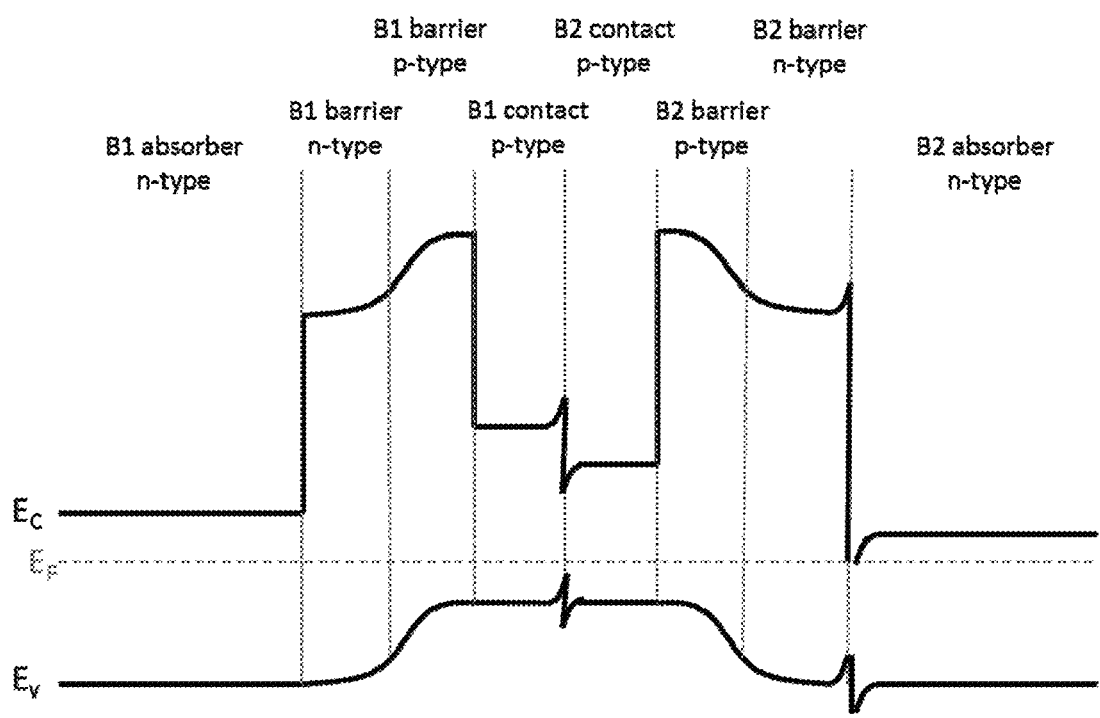

FIG. 5*c* presents a band structure for structure 600 where there are band discontinuities between the contact layer 650 and the contact layer 660 as well as the barrier 670 and the absorber 680. It is to be understood that a back-to-back n-CB-p version of the structure 600 can also be implemented as described in FIG. 5*d-e* for materials that require a p-type absorber. In this case, the absorber 630 and the absorber 680 are doped p-type. The barriers are hole barriers instead of electron barriers and the contact regions are doped n-type.

Figure 5D:
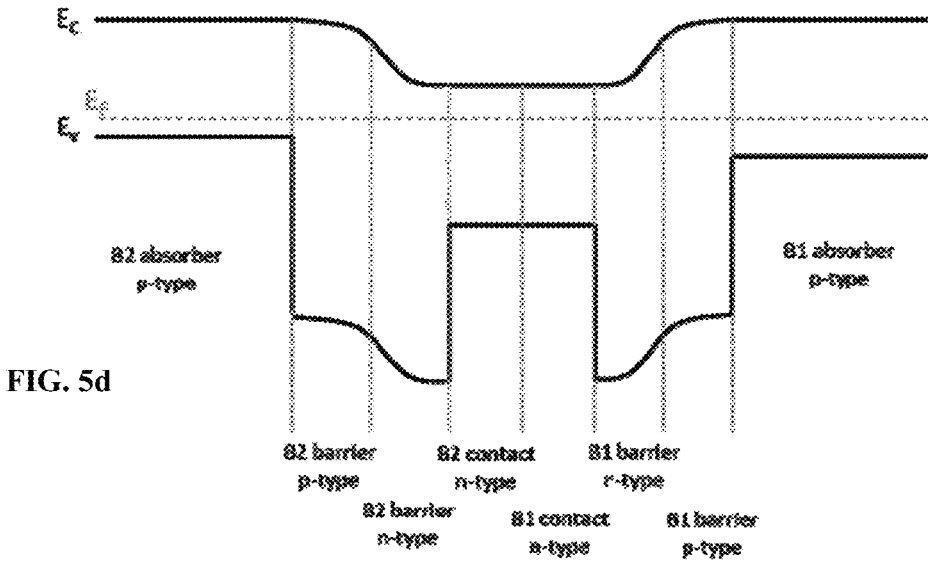
Figure 5E:
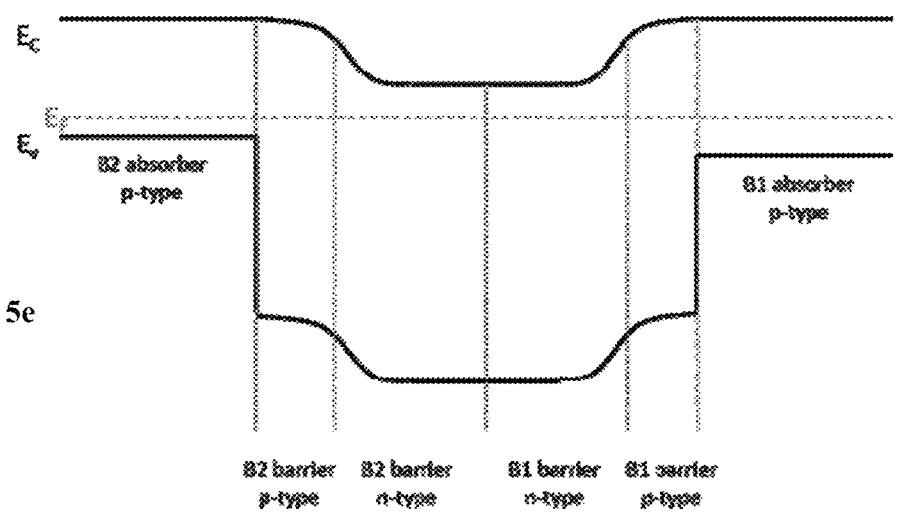

FIG. 5*d* present band structure for structure 600 where the contact layers 650, 660 have low bandgap. FIG. 5*e* present band structure for structure 600 where the contact layers 650, 660 have high bandgap.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. An infrared detector comprising:
a second detector disposed above a first detector,
wherein the first detector comprises a first infrared absorber layer comprising In, As, and Sb, a first barrier layer disposed above the first infrared absorber layer, and a first contact layer disposed above the first barrier layer,
wherein the second detector comprises a second contact layer disposed above the first contact layer, a second barrier layer disposed above the second contact layer, and a second infrared absorber layer comprising In, As, and Sb and disposed above the second barrier layer,
wherein the first infrared absorber layer has a different type of doping than the first contact layer, and
wherein at least one of the first barrier layer or the second barrier layer comprises a p-type barrier layer and an n-type barrier layer.

2. The infrared detector of claim 1, wherein the first contact layer has the same type of doping as the second contact layer.

3. The infrared detector of claim 1, wherein the first barrier layer is configured to reduce dark current by blocking majority electron carriers.

4. The infrared detector of claim 1, wherein the second barrier layer is configured to reduce dark current by blocking majority electron carriers.

5. The infrared detector of claim 1, wherein the first and second contact layers comprise low bandgap.

6. The infrared detector of claim 1, wherein the first and second contact layers comprise high bandgap.

7. The infrared detector of claim 1, wherein the infrared detector is configured to perform imaging in middle wavelength infrared (MWIR) range and long wavelength infrared (LWIR) range.

8. The infrared detector of claim 1, wherein the infrared detector is configured to perform imaging in middle wavelength infrared (MWIR) or long wavelength infrared (LWIR) range based on overall bias polarity.

9. The infrared detector of claim 1, wherein the infrared detector is configured to operate at low bias due to an electric field within the first barrier layer and the second barrier layer.

10. The infrared detector of claim 1, wherein the first contact layer and the second contact layer are highly doped layers.

11. The infrared detector of claim 1, wherein the first contact layer and the second contact layer are different parts, and the first detector and the second detector are independently optimized.

12. The infrared detector of claim 1, wherein the first contact layer and the second contact layer abut against each other.

13. The infrared detector of claim 1, wherein the second infrared absorber layer abuts against the second barrier layer, and
wherein the first contact layer abuts against the first barrier layer.

14. The infrared detector of claim 1, wherein at least one of the first infrared absorber layer or the second infrared absorber layer has a superlattice structure comprising In, As, and Sb.

15. The infrared detector of claim 1, wherein there are band discontinuities between the second barrier layer and the second infrared absorber layer.

16. The infrared detector of claim 1, wherein the first infrared absorber layer and the second infrared absorber layer are each n-doped, and
wherein the first contact layer and the second contact layer are each p-doped.

17. The infrared detector of claim 1, wherein at least one of the first infrared absorber layer or the second infrared absorber layer is a InAsSb layer.

18. An infrared detector comprising:
a second detector disposed above a first detector,
wherein the first detector comprises a first infrared absorber layer comprising In, As, and Sb, a first barrier layer disposed above the first infrared absorber layer, and a first contact layer disposed above the first barrier layer,
wherein the second detector comprises a second contact layer disposed above the first contact layer, a second barrier layer disposed above the second contact layer, and a second infrared absorber layer comprising In, As, and Sb and disposed above the second barrier layer,
wherein the first infrared absorber layer has a different type of doping than the first contact layer, and
wherein there are band discontinuities between the first contact layer and the second contact layer.

19. The infrared detector of claim 18, wherein at least one of the first barrier layer or the second barrier layer comprises a p-type barrier layer and an n-type barrier layer.

20. An infrared detector comprising:
a second detector disposed above a first detector,
wherein the first detector comprises a first infrared absorber layer comprising In, As, and Sb, a first barrier layer disposed above the first infrared absorber layer, and a first contact layer disposed above the first barrier layer,
wherein the second detector comprises a second contact layer disposed above the first contact layer, a second barrier layer disposed above the second contact layer, and a second infrared absorber layer comprising In, As, and Sb and disposed above the second barrier layer,
wherein the first infrared absorber layer has a different type of doping than the first contact layer, and
wherein:
a valence band of the second barrier layer and a valence band of the second infrared absorber layer are aligned at a boundary between the second barrier layer and the second infrared absorber layer; or
a conduction band of the second barrier layer and a conduction band of the second infrared absorber layer are aligned at the boundary between the second barrier layer and the second infrared absorber layer.

21. The infrared detector of claim 20, wherein at least one of the first barrier layer or the second barrier layer comprises a p-type barrier layer and an n-type barrier layer.

* * * * *